United States Patent [19]

Chien

[11] Patent Number: 4,897,336

[45] Date of Patent: Jan. 30, 1990

[54] SELF-DEVELOPING RADIATION SENSITIVE RESIST WITH AMORPHOUS POLYMER HAVING HALOALKYL SUBSTITUTION DERIVED FROM CYCIC ETHER

[76] Inventor: James C. W. Chien, 15 Coach La., Amherst, Mass. 01002

[21] Appl. No.: 132,643

[22] Filed: Dec. 8, 1987

Related U.S. Application Data

[63] Continuation-in-part of Ser. No. 850,606, Apr. 11, 1986, abandoned.

[51] Int. Cl.$^4$ .............................................. G03C 1/495
[52] U.S. Cl. ..................................... 430/197; 430/270; 430/296; 430/297; 430/326; 430/328; 430/942; 430/966; 430/967
[58] Field of Search ............... 430/270, 197, 297, 966, 430/967, 296, 942

[56] References Cited

U.S. PATENT DOCUMENTS

| | | | |
|---|---|---|---|
| 2,937,085 | 5/1960 | Soven et al. | 430/197 |
| 3,840,390 | 10/1974 | Kozer et al. | 430/197 |
| 3,915,704 | 10/1975 | Limburg et al. | 430/290 |
| 3,915,706 | 10/1975 | Limberg et al. | 430/210 |
| 3,917,483 | 11/1975 | Limberg et al. | 430/270 |
| 3,940,507 | 2/1976 | Fech et al. | 430/296 |
| 3,963,491 | 6/1976 | Marsh | 430/270 |
| 3,964,907 | 9/1975 | Marsh | 430/270 |
| 4,087,411 | 5/1978 | Sugio et al. | 528/249 |
| 4,202,566 | 5/1986 | Kosche | 427/150 |
| 4,247,611 | 1/1981 | Sander et al. | 430/270 |
| 4,248,957 | 2/1981 | Sander et al. | 430/270 |
| 4,262,081 | 4/1981 | Bowden et al. | 430/296 |
| 4,289,845 | 9/1981 | Bowden et al. | 430/270 |
| 4,311,782 | 7/1980 | Buhr et al. | 430/270 |
| 4,506,003 | 3/1985 | Ruckert et al. | 430/270 |
| 4,508,814 | 4/1985 | Sakurai et al. | 430/303 |

FOREIGN PATENT DOCUMENTS

| | | |
|---|---|---|
| 0096895 | 12/1983 | European Pat. Off. . |
| 0126214 | 2/1984 | European Pat. Off. . |
| 0102450 | 3/1984 | European Pat. Off. . |
| 0111655 | 6/1984 | European Pat. Off. . |
| 198448 | 11/1984 | Japan ................................... 430/270 |

OTHER PUBLICATIONS

Potropoulos, C., Journal of Polymer Science, No. 7, vol. 15, pp. 1637–1644, 1977.
Brewer, T., Polymer Eng. and Science, Jul. 1974, vol. 14, No. 7, pp. 534–537.
Chemical Abstracts, vol. 90, #130684v, 1979 (Sukegawa et al.).
"Chemical Amplification in the Design of Polymers for Resist Applications" (Willson et al.), p. 448.
"Applications of Photo Initiators to the Design of Resists for Semiconductor Manufacturing" (Ito et al.), pp. 60–69.
Hatada, K. et al., "Highly Sensitive Self Developing Electron–Beam Resist of Aldehyde Copolymer", Polymer Bulletin, 8, pp. 469–472, 1982.

Primary Examiner—Charles L. Bowers, Jr.
Attorney, Agent, or Firm—Rines and Rines

[57] ABSTRACT

A self-developing radiation resist having extremely high sensitivity to energetic radiation, which resist is resistant to dry etching. The energetic radiation includes electron beam radiation, ion beam radiation, x-ray radiation, and gamma ray radiation. The resist is substantially amorphous; it has extremely high values of $G_s$ and $G_m$, where $G_s$ = number of main chain scission/100 electron volts absorbed and $G_m$ = number of monomers liberated/100 electron volts absorbed.

The resist is end-capped to render it thermally stable and typically is cross-linked to reduce dry etching. The polymer that forms the resist includes an oxygen heteroatom linear chain organic polymer having haloalkyl substituents and is adapted to depolymerize in the absence of photoinitiators.

12 Claims, 1 Drawing Sheet

SELF-DEVELOPING RADIATION SENSITIVE RESIST WITH AMORPHOUS POLYMER HAVING HALOALKYL SUBSTITUTION DERIVED FROM CYCIC ETHER

This application is a continuation-in-part of Application Ser. No. 850,606, filed Apr. 11, 1986, abandoned.

The present invention relates to self-developing resists that may be used, for example, in the manufacture of integrated circuits.

Self-developing resists that do not require solvents to develop the latent image of the resist after exposure, have been proposed for use in the microlithography of semiconductors for the manufacture of integrated circuits. By avoiding the use of solvents which can soften and swell the resist materials immediately adjacent to the exposed area resulting in loss of contrast and resolution, self-developing resists offer better imaging and simpler processing than conventional solvent developed resists.

Self-developing resists based on polyaldehydes are known; see Ito et al., European Pat. Pub. 111,655 and 126,214. Aldehydes undergo reversible ionic polymerization-depolymerization equilibria. Many of these aldehyde polymers have ceiling temperatures ($T_c$) below room temperatures, and polymerization must be carried out at temperatures well below $T_c$. If the reaction is heated, the polymer rapidly depolymerizes to monomers. In order to prevent depolymerization, the polymers are end-capped by acylation, alkylation, and other suitable reactions. End-capped polyphthalaldehyde with triarylsulfonium or diphenyl iodonium hexafluoroarsenates as light-sensitive initiators have been proposed as microlithographic resists. The initiator on exposure to light generates a strong acid which cleaves the polyaldehyde chain. This re-establishes the polymerization equilibrium at a temperature above $T_c$ and the polymer unzips into monomeric fragments. Since a single molecule of acid is capable of liberating many monomers, the sensitivity of the resist is dependent on the number of monomers cleaved by the acid and resolution of the resist image depends upon the distance the acid can diffuse. Ito et al., European Pat. Pub. 102,450, describes such a resist with a copolymer of poly(tert-butyloxycarbonyloxy-alpha-alkylstyrene) and tert-butylesters of carboxylic acid with cationic photoinitiators such as diaryliodonium metal halides and a dye to sensitize the photoinitiator. The monomeric fragments from the unzipping of these polymers are difficult to vaporize and heating of the substrate is required to develop the image. As this is a photoresist system, the minimum feature size is limited by the wavelength of the visible light. Electron beam or X-ray or other energetic radiation is necessary to produce submicron features.

Hatada et al., European Pat. Pub. 96,895, describes an organic copolymer of at least two aliphatic aldehydes of the formula RCHO, where R is alkyl, haloalkyl, aralkyl or halogenated aralkyl. These copolymers form resists that depolymerize to volatile monomers on exposure to energetic radiation such as electron beam, X-ray, gamma ray or ion beam radiation. Tests with these resists have been limited to only very thin coatings because contrast values are relatively low and tend to decrease as the resist film thickness increases. Thus, it is difficult to get good resist thickness and good image contrast. The polymers used as resist films by Hatada et al. depolymerize without exposure at relatively low temperatures, e.g., many have up to 20 percent weight loss at temperatures as low as 135° C. Such materials would not survive the usual pre-baking and post-baking environments (e.g., 100 to 150 degrees C.). Three further difficulties with the aldehyde copolymer resist of Hatada et al. are: (1) They form relatively soft, easily damaged coatings; (2) a thin residue of resist remaining in the exposed areas has been observed; and (3) radiolysis of the halogenated aralkyl moiety can result in crosslinking.

It is an objective of the present invention to provide a new family of self-developing resists.

Another objective is to provide a resist that is particularly adapted for use in processes wherein radiation exposure is one of electron beam radiation, ion beam radiation, X-ray radiation, and gamma ray radiation.

Still another objective is to provide a resist in the form of polymer which, when irradiated, provides sharp, well-defined demarcation between that portion of a resist surface which is exposed to radiation and the contiguous portion which is not.

A further objective is to provide a resist whose unexposed regions can be cross-linked by visible/ultraviolet rays to enable dry etching by plasma or other means of the exposed image regions.

These and still further objectives are addressed hereinafter.

SUMMARY OF THE INVENTION

The present invention provides novel, self-developing, dry-etchable resists from substantially amorphous oxygen heteroatom linear chain polymers with haloalkyl substituents, and provides a process for applying a resist image to a substrate. More particularly, this invention provides a process for producing a positive, radiation-imaged pattern on a substrate by coating the substrate with an oxygen heteroatom linear chain polymer with haloalkyl substituents, and exposing those areas of the coating outside the desired pattern to radiation which induces the coatings in the exposed areas to depolymerize to monomeric fragments.

In another form of the invention the copolymer resist materials include azido monomers to impact high-resist durability in microlithographic processes using the plasma-etch technology.

In yet another form of the invention the resist is based on copolymers of cyclic ethers or aliphatic aldehydes, halogenated aldehydes, halogenated cyclic ethers, cross-linked with photoactive additives such as azido derivatives of 1–12 carbon atoms to further increase the durability of the resist image.

DETAILED DESCRIPTION OF THE INVENTION

Figure 1A:
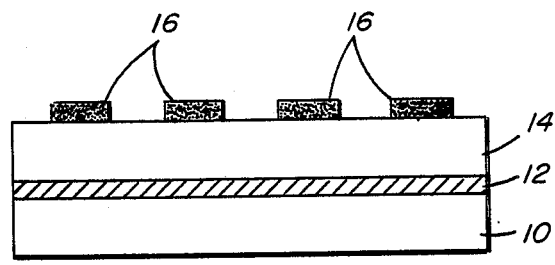
FIGS. 1A–1E are flow sheets which schematically illustrate the steps A–E of one aspect of this invention. Wherever a resist according to the present teaching is used in connection with radiation imaging or plasma etching of a substrate, cross-hatching and shading is used to distinguish layers of a semiconductor wafer with resist thereon, rather than to indicate section views.

The process of this invention utilizes as self-developing resists, oxygen heteroatom, linear chain polymers preferably formed from one halogenated monomer.

These oxygen heteroatom, linear chain polymers are amorphous, have cryogenic $T_c$'s and will depolymerize (unzip) at room temperature. $T_c$ for these polymers is in the range between about 15 degrees C. and $-70$ degrees C., and mostly is below 0 degrees C. The depolymerization reaction is initiated by a radiation-induced dissociative electron capture process, or other types of processes which produce ionic intermediates.

The novel self-developing resist polymers have the general formula:

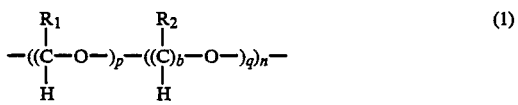

wherein $R_1$ is a haloalkyl substituent of the formula $-CH_{2-a}X_aR'$, $R'$ is X or an alkyl, haloalkyl, aryl or silyl substituent having 1 to 6 carbon atoms, X is chlorine or fluorine, a is 1 or 2, excluding $F_2CH-$ and $FCH_2-$; $R_2$ is H, an alkyl substituent selected from the group consisting of aliphatic primary, secondary or tertiary alkyl groups comprising 1 to 7 carbon atoms, or halogenated derivatives thereof; p is a small integer, preferably greater than 0 and less than 10, q is a small integer greater than 0, preferably less than 10, b is small integer not less than 2, preferably less than 10, and n is a large integer, preferably greater than 20.

Polymers of the general formula (1) set forth above and including the (C)$_b$-O repeating unit in the linear chain exhibit improved resistance to spontaneous depolymerization as compared with known resist polymers including only consecutive C-O units in the linear chain. Thus, the resist polymers of the present invention are far more stable.

A first type of polymers of the general formula (1) include polymers formed from cyclic ethers, including haloalkyl substituted cyclic ethers. The polymers may be formed, for example, from cyclic ether acetals. Polymers of the general formula (1) formed from cyclic ethers may comprise, for example, any of the following repeating units:

$-(-CH_2-CH_2-CH_2-CH_2-O-)_n-$;
$-(-CH_2CH_2-O-CH_2-O-)_n-$;
$-(-CH_2CH_2CH_2CH_2-O-CH_2-O-)_n-$);

$-(-CH_2CH_2-O-CH_2CH_2-O-CH_2-O-)_n$; (2)

(B)

or halogenated derivatives thereof, for example, containing the $R_1$ group as defined above.

Units derived from the halogenated monomer comprise preferably at least five mole percent and more preferably less than 50 mole percent of the polymer in order to provide a polymer which can be dissolved in suitable solvents for application to the substrates.

The incorporation of the halogenated group greatly improves the sensitivity of the resist to energetic radiation, the solubility of the polymer for easy application to the substrate, and the stiffness of the backbone of the copolymer chain, thus providing a tougher film.

A second type of the novel self-developing resist polymers of formula (1) are derived from a halogenated aliphatic aldehyde, for example, of the formula $R_1CHO$ where $R_1$ is as defined above, and a cyclic ether such as tetrahydrofuran, dioxolane, dioxepane, trioxocane, and their alkyl and halogenated alkyl derivatives.

The polymers used for the resists according to this invention preferably have a molecular weight above 10,000 and up to 50,000.

The preferred halogenated monomers are those containing alpha chloro and fluoro substituted alkyls. The bromo and iodo substituted alkyl derivatives tend to be nonvolatile; polymers containing such monomers generally have low stability and tend to cross-link when irradiated with energetic radiations.

One of the possible mechanisms to greatly enhance sensitivity of the novel self-developing resist is the electron capture dissociation of the alpha halogenated side chain upon irradiation as exemplified by poly(trichloroacetaldehyde),

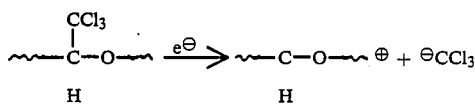

and by poly(dioxolane)

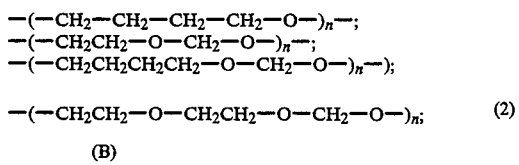

Formation of the carbocation initiates the depolymerization of the low-ceiling temperature resist material.

The incorporation of the alpha halo substituted aldehyde monomers into the oxygen heteroatom linear chain polymer according to the processes of this invention surprisingly provides effective chain scission at low-radiation energy input for self-development of the resist. The effectiveness of our novel self-developing resist is described by two quantities:

$$G_s = \frac{\text{number of main chain scission}}{100 \text{ electron volts absorbed}}, \quad (5)$$

and $$G_m = \frac{\text{number of monomers liberated}}{100 \text{ electron volts absorbed}}.$$

In the case where there is negligible chain transfer during unzipping by irradiation, then $G_m \approx G_s \overline{M}_n$, where $\overline{M}_n$ is the number average molecular weight of the polymer. For the prior art polymethylmethacrylate $G_s=1.3$ and $G_m < G_s$. However, for a typical resist according to this invention, $G_s$ is greater than 5 and $G_m$ is greater than 100. Preferably, the $G_m$ is in excess of 10,000, i.e., more than 10,000 monomers are liberated for every 100 electron volts of energy absorbed and $G_s$ is greater than 7.

The radiation energy for exposure and self-development of the resist may be provided by energetic radiation such as gamma ray, X-ray, electron beam or DUV (deep ultraviolet) radiation. Exposure and self-development by X-ray and electron beam are very effective in vacuum, but DUV exposure should be in an atmosphere with oxygen present to obtain efficient chain scission for self-development. Because the chain scission is an intramolecular event without the use of separate light initiated catalyst, the resolution of self-developing resists according to this invention is high. In the absence of radiation scattering, the resolution would be in the order of 60–270 Angstrom, depending upon the particular resist.

The polymer and copolymer resists of this invention may be used without further modification, or they may be modified to increase the durability of the resist image. One such modification suitable for the preparation of self-developing resists for plasma-etching processes is also novel. The principle of this invention is the incorporation by copolymer of another monomer having a photosensitive moiety Z. Following the imaging process, the unexposed resist is irradiated with ultraviolet light which is absorbed by the chromophore Z generating an active species leading to cross-linking of the resist. The cross-linked resist has increased stability toward plasma during the etching process. Since there are only a few such cross-links per molecule, they do not affect the subsequent stripping process. An alternative of copolymerization of a monomer with a Z moiety is the introduction of a bifunctional additive with two Z moieties which, upon photolysis, can act to cross-link the resist.

A particularly good Z moiety is an azide group which is readily photolyzed to form nitrene and insertion into the C—H bond of the resist molecule. For instance, the azide group may be incorporated by the inclusion of 1–10 mole percent of m-azido-benzaldehyde in the halogenated monomer to form a copolymer, or with a haloaldehyde monomer and cyclic ether monomer to form a terpolymer. The copolymers or terpolymers should be dissolved in a suitable solvent, applied to a substrate and dried to form a resist layer. The resist layer is exposed by electron beam radiation or the like to form the resist image. The radiation causes the depolymerization or unzipping of the exposed portion of the resist, which self-develops the resist image. Afterwards the resist is exposed to ultraviolet radiation to cause photolysis of the azide functionality resulting in cross-linking of the resist.

In an alternate method for cross-linking, the resist to provide a self-developing resist suitable for use in plasma-etching processes, an azido cross-linking agent may be added to a polymer or copolymer solution before applying the resist solution to a substrate and drying it on the substrate. One such cross-linking agent is bisazidoformate. Thus, ten percent by weight of bisazidoformate is added to a polymer solution. After the resist solution is applied to a substrate, dried and exposed (self-developed), the resist image formed is exposed to ultraviolet radiation in air. Irradiating the resist image breaks the azidoformate into nitrene, extracts hydrogen from the polymer chains and forms amide linkages as cross-links.

In order to illustrate the processes of the invention, the utilization of a self-developing resist for a plasma-etching step in the manufacture of an integrated circuit is schematically illustrated in FIGS. 1A–1E. Referring to FIG. 1A, a substrate consisting of a silicon wafer 10 having a layer of silicon dioxide 12 is shown. This substrate is coated with a layer of cross-linkable resist 14. The resist is a self-developing, cross-linkable resist as described above. The resist is applied as a solution and dried by techniques well-known in the microelectronic manufacturing art. An imaging mask 16 is shown in position over the resist.

Figure 1B:
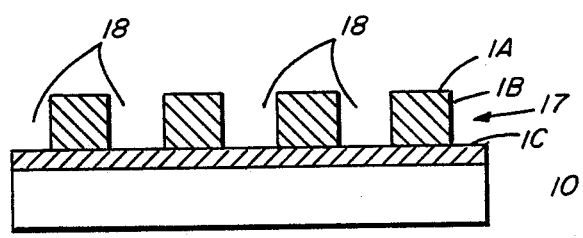

In FIG. 1B the substrate is shown after exposure to the resist to electron beam or X-ray radiation. The exposed portions of the resist have depolymerized and evaporated in the exposed regions labeled 18 leaving the resist image 17. FIG. 1B illustrates a desired resulting structure: A structure having a well-defined demarcation (i.e., a right angle) between the upper surface marked 1A of the resist image 17 and its side wall 1B and between the side wall 1B and the bottom labeled 1C. Ideally, the angles are right angles between contiguous regions on the substrate.

Figure 1C:
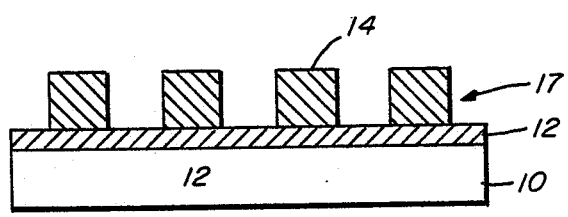

In FIG. 1C the resist image has been cross-linked by exposure to ultraviolet radiation.

Figure 1D:
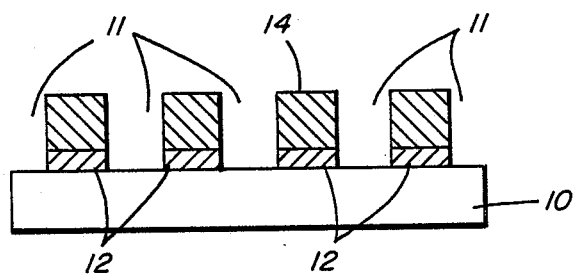

In FIG. 1D the silicon wafer 10 is shown after the unwanted portions 11 of the silicon dioxide layer 12 have been removed by plasma etching through the resist image.

Figure 1E:
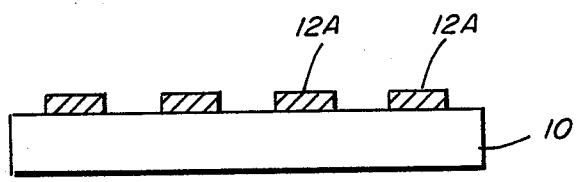

In FIG. 1E the silicon wafer is shown with the silicon dioxide pattern 12A on it after stripping the resist image.

Methods for the polymerization or preparation of the amorphous resist polymers are illustrated in the examples.

EXAMPLE 1

Equimolar quantitites of monochloroacetaldehyde and diethylene glycol in benzene were refluxed for twenty-four hours in the presence of p-toluene sulfonic acid to produce 2-chloromethyl-1,3 6-trioxocane. This monomer was polymerized as follows. The monomer and distilled toluene were placed in a vessel which had been cleaned by flame drying under vacuum and then filled with dry argon. The vessel contents were cooled and a triethylaluminum catalyst was added slowly with stirring. The vessel was flushed with argon and then sealed. After forty-eight hours the polymerization reaction was stopped and the polymer was precipitated by adding dry methanol, filtered and dried in vacuum. The homopolymer of 2-chloromethyl trioxocane had a $G_m$ value of 12,100.

EXAMPLE 2

The polymer of Example 1 was dissolved in methylene chloride and 5 percent by weight of bisazidoformate was added to the solution. The solution was spin coated onto a silicon wafer to form self-developing plasma-etchable resist film.

EXAMPLE 3

A methylene chloride solution of 60 mole percent chloromethyl trioxocane and 40 mole percent of 1,3-dioxolane containing $BF_3$-$Et_2O$ initiator was polymerized at −10° C. for twenty-four hours. Addition of methanol precipitated the copolymer containing 65 mole percent of 1,3-dioxolane and 35 mole percent of chloromethyl trioxocane. The copolymer was solvent casted into mechanically-strong and radiation-sensitive resist film.

Further modifications of the invention will occur to persons skilled in the art and all such modifications are deemed to be within the scope of the invention as defined by the appended claims.

What is claimed is:

1. A radiation resist having extremely high sensitivity to energetic radiation, which resist is self-developing and is resistant to dry etching, said energetic radiation including electron beam radiation, ion beam radiation, x-ray radiation, and gamma ray radiation, said resist being in the form of a substantially amorphous oxygen heteroatom linear chain polymer with haloalkyl substituents, said polymer being derived from (a) a cyclic ether, (b) a haloalkyl substituted cyclic ether, or (c) a cyclic ether with an aliphatic aldehyde, at least one of which includes a haloalkyl substituent, which polymer is adapted to depolymerize in the absence or presence of photo initiators, said polymer being of the formula

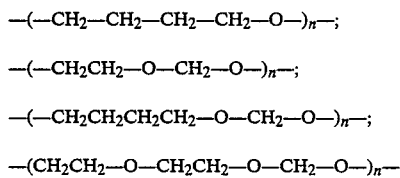

wherein $R_1$ is a haloalkyl substituent of the formula $-CH_{2-a}X_aR'$, $R'$ is X or an alkyl, haloalkyl, aryl or silyl substituent having 1 to 6 carbon atoms, X is chlorine or fluorine, a is 1 or 2, excluding $F_2CH-$ and $FCH_2-$; $R_2$ is H, an alkyl substituent selected from the group consisting of aliphatic primary, secondary or tertiary alkyl groups comprising 1 to 7 carbon atoms, or halogenated derivatives thereof; p is 0 or a small integer, q is a small integer greater than 0, b is small integer not less than 2, and n is a large integer.

2. A radiation resist according to claim 1, wherein p is greater than zero and less than 10, q is less than 10, a is less than 10 and n is greater than 20.

3. A radiation resist according to claim 1, wherein the polymer is derived from a cyclic ether and includes one of the following repeating units:

$-(-CH_2-CH_2-CH_2-CH_2-O-)_n-$;

$-(-CH_2CH_2-O-CH_2-O-)_n-$;

$-(-CH_2CH_2CH_2CH_2-O-CH_2-O-)_n-$;

$-(CH_2CH_2-O-CH_2CH_2-O-CH_2-O-)_n-$ wherein n is a large integer.

4. A radiation resist according to claim 1, wherein the polymer is derived from a haloalkyl substituted cyclic ether and includes a halogenated derivative of one of the following repeating units:
$-(-CH_2-CH_2-CH_2-CH_2-O-)_n-$;

$-(-CH_2CH_2-O-CH_2-O-)_n-$;

$-(-CH_2CH_2CH_2CH_2-O-CH_2-O-)_n-$;

$-(-CH_2CH_2-O-CH_2CH_2-O-CH_2-O-)_n-$ wherein n is a large integer.

5. A radiation resist according to claim 1, wherein said polymer comprises a copolymer derived from a halogenated aliphatic aldehyde which has the general formula $R_1CHO$, where $R_1$ is a haloalkyl substituent of the formula $-CH_{2-a}X_aR'$, $R'$ is X or an alkyl, haloaklyl, aryl or silyl substituent with 1-6 carbon atoms, X is chlorine or fluorine, excluding $F_2CH-$ and $FCH_2-$, and a is 1 or 2, and a cyclic ether.

6. A radiation resist according to claim 5, wherein the cyclic ether is selected from the group consisting of tetrahydrofuran, dioxolane, dioxepane, trioxocane, and halogenated derivatives thereof, said halogenated monomer being between about five mole percent and fifty mole percent of the polymer.

7. A radiation resist according to claim 1, wherein said polymer has a ceiling temperature $T_c$ less than about 80° C.

8. A radiation resist according to claim 1, wherein the $G_s$ is greater than 5 and the $G_m$ is greater than 100, wherein $$G_s = \frac{\text{number of main chain scission}}{100 \text{ electron volts absorbed}},$$

$$G_m = \frac{\text{number of monomers liberated,}}{100 \text{ electron volts absorbed.}}$$

9. A resist according to claim 1, wherein the resist has a $G_m$ greater than 100, wherein $$G_m = \frac{\text{number of monomers liberated,}}{100 \text{ electron volts absorbed.}}$$

10. A resist according to claim 9, wherein the resist has a $G_m$ in excess of 5,000, whereby more than 5,000 monomers are liberated for every 100 electron volts of energy absorbed by the resist.

11. A radiation resist according to claim 1, wherein the polymer further includes an azido monomer to impart photosensitivity and permit crosslinking on exposure to ultraviolet radiation.

12. A radiation resist according to claim 1, which further includes a photolyzable additive having at least two azide groups.

* * * * *